United States Patent
Ferrario

Patent Number: 6,040,730
Date of Patent: Mar. 21, 2000

[54] INTEGRATED CAPACITANCE MULTIPLIER ESPECIALLY FOR A TEMPERATURE COMPENSATED CIRCUIT

[75] Inventor: Bruno Ferrario, Fino Mornasco, Italy

[73] Assignee: SGS-Thomson Microelectronics S.r.l., Agrate Brianza, Italy

[21] Appl. No.: 08/098,740

[22] Filed: Jul. 28, 1993

[30] Foreign Application Priority Data

Jul. 28, 1992 [EP] European Pat. Off. ............. 92830419

[51] Int. Cl.$^7$ .............................. G06G 7/64; H03B 1/00
[52] U.S. Cl. ......................... 327/344; 327/553; 327/552
[58] Field of Search .................................. 307/491, 310, 307/520, 521, 497, 605

[56] References Cited

U.S. PATENT DOCUMENTS

| | | | |
|---|---|---|---|
| 3,831,117 | 8/1974 | Fletcher et al. | 330/69 |
| 4,477,737 | 10/1984 | Ulmer et al. | 307/491 |
| 4,587,437 | 5/1986 | Schorr | 307/109 |
| 5,006,733 | 4/1991 | Brown | 307/491 |
| 5,034,626 | 7/1991 | Pirez et al. | 307/310 |
| 5,095,227 | 3/1992 | Jeong | 307/310 |
| 5,130,571 | 7/1992 | Carroll | 307/491 |

FOREIGN PATENT DOCUMENTS 0-450-866  10/1991  European Pat. Off. .

OTHER PUBLICATIONS

IBM Technical Disclosure Bulletin: vol. 31, No. 2, Jul. 1988, p. 414 New York, US In. 15–In. 22.

*Primary Examiner*—Toan Tran
*Attorney, Agent, or Firm*—Theodore E. Gallanthay; Allen, Dyer, Doppelt, Milbrath & Gilchrist, P.A.

[57] ABSTRACT

An integrated capacitance multiplier circuit utilizes a pair of field effect transistors, biased in a conducting state, as virtual resistances of a classic operational amplifier network for implementing a capacitance multiplier function. The two field effect transistors have different sizes from each other for attaining a given ON-resistance ratio. A biasing circuit provides independently adjustable biasing voltages for the two field effect transistors. At least one of the two biasing voltages produced by the biasing circuit can be made dependent on temperature according to a certain dependency law in order to exploit the capacitance multiplier circuit for temperature compensating an integrated RC circuit employing the virtual capacitance provided by the multiplier circuit.

22 Claims, 3 Drawing Sheets

INTEGRATED CAPACITANCE MULTIPLIER ESPECIALLY FOR A TEMPERATURE COMPENSATED CIRCUIT

CROSS-REFERENCE TO RELATED APPLICATION

This application claims priority from European App'n 92830419.5, filed Jul. 28, 1992, which is hereby incorporated by reference.

BACKGROUND AND SUMMARY OF THE INVENTION

The present invention relates to integrated circuits which require capacitors.

It is difficult to realize large capacitances in an integrated circuit. Typical MOS capacitors may have a specific capacitance which requires a number of square microns to provide even one picoFarad of capacitance. (Capacitance is directly proportional to the area of semiconducting substrate which may be used for integrating a capacitor.) However, many functional circuits require the use of relatively high capacitances, which cannot practicably be implemented as a physical integrated circuit capacitor. (For example, this may be particularly difficult when it is necessary to implement filters with cutoff frequencies in the audio band or below, e.g. 10 Hz.)

The problem may be resolved by the use of a so-called capacitance multiplier circuit. Several circuits which implement the function of a capacitance multiplier for a real (physical) capacitor (having an easily integratable size) and which are described in literature. These circuits often contain an operational amplifier.

A typical capacitance multiplier circuit which may be easily integrated is shown in FIG. 1. The intermediate node between the two resistances R1 and R2 constitutes the terminal of a "virtual" capacitor having a capacitance given by:

$$Cm=R1/R2\ C$$

where C is the capacitance of a physically integrated capacitor.

In order to obtain a virtual capacitance of about 10 nF from a physical capacitance of about 100 pF, it is necessary to use two well matched integrated resistances having a ratio of resistance equal to about 100. Moreover, the smaller resistance (R2) should advantageously have a relatively small value because it determines the series resistance of the virtual capacitance which is obtained.

The realization of a pair of well matched integrated resistances which have a relatively large resistance ratio and which have low to moderate temperature coefficients is not a technically insurmountable problem, but the solution requires a large amount of surface area on a semiconductor substrate.

An alternative and more advantageous solution is provided by the present invention. One main object of the invention is to provide an improved capacitance multiplier circuit which utilizes two field effect transistors in place of the two resistances connected in series as shown in FIG. 1.

In the circuit of the invention, a given resistance ratio is functionally implemented by using the ratio between the ON-resistances (e.g. channel resistances) of the two field effect transistors. These transistors have dimensions, commonly indicated in terms of channel width (W) and channel length (L) as a ratio W/L, which is selected to obtain the desired ratio between the respective ON-resistances. The two field effect transistors are essentially used in a state of conduction, by suitably biasing a control gate of a latch transistor.

The advantages of the capacitance multiplier circuit of the invention are remarkable. It offers greater versatility of the circuit in comparison to known circuits using two integrated resistances. In many cases, the circuit of the invention as intended permits the saving of semiconductor area.

According to a preferred embodiment of the invention, the two field effect transistors each having a source region and a drain region separated by a channel region topped by a control gate structure are controlled by an applied biasing voltage. This permits implementation of an RC circuit utilizing an integrated resistance (R) and a capacitance (C). The virtual capacitance is produced by means of the multiplier circuit of the invention, which is intrinsically temperature-compensated. This is possible because the biasing voltage which is applied to the control gate of any one of the two transistors may be varied independently from the biasing voltage which is applied to the other transistor.

According to such a preferred embodiment, the capacitance multiplier circuit of the invention is provided with a biasing circuit having at least two output nodes which are connected to the control gate of the two field effect transistors. Each of the voltages which are produced on the output nodes of the biasing circuit may be generated according to a certain temperature-dependency law, for varying the ratio between the channel resistances of the two field effect transistors as a function of the temperature. This is done in order to compensate for the variation resistance caused by a variation of temperature.

In this way, a temperature independent integrated RC circuit may be implemented by using a capacitor having a multiplied virtual value.

Of course, for applications where such a temperature compensation is not necessary or required, the two field effect transistors may be biased with fixed voltages.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 2:
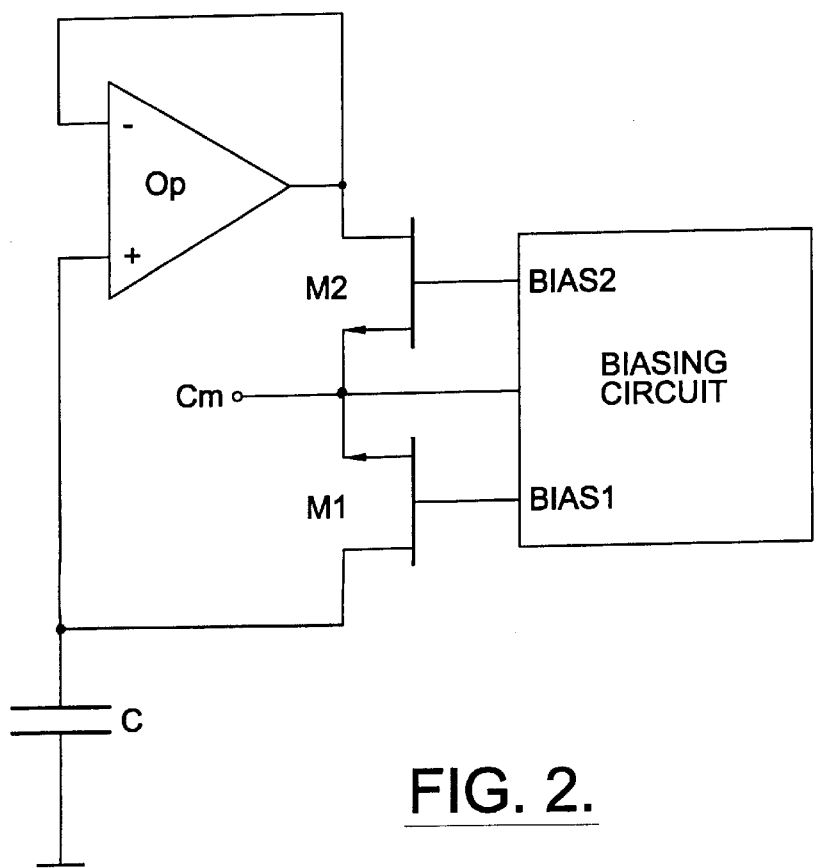
FIG. 2 is a functional diagram of a capacitance multiplier circuit according to a preferred embodiment of the invention.

With reference to FIG. 2, the capacitance multiplier circuit of the disclosed invention contains an operational amplifier Op, configured as a buffer (i.e. as a non-inverting, unit gain, voltage follower circuit, having an output node which is directly connected to an inverting input.) A physical capacitor C which may be integrated (e.g. as a MOS capacitor), is connected between a common potential node of the circuit (e.g. ground) and the non-inverting input of the operational amplifier. The multiplying network is functionally composed of two field effect transistors, M1 and M2, which are connected in opposition to each other between the output node of the amplifier and the non-inverting input (to which the physical capacitor C is connected).

In the example shown in FIG. 2, the two field effect transistors are n-channel transistors, having their respective source regions connected. The M2 transistor has a drain connected to the output node of the amplifier and the M1 transistor has a drain connected to the non-inverting input of the amplifier. The sizes of the two transistors, M1 and M2, are chosen to achieve a certain desired ratio between their respective channel resistances when they are in a conduction state, as determined by the biasing conditions established through the respective control gates.

Figure 1:
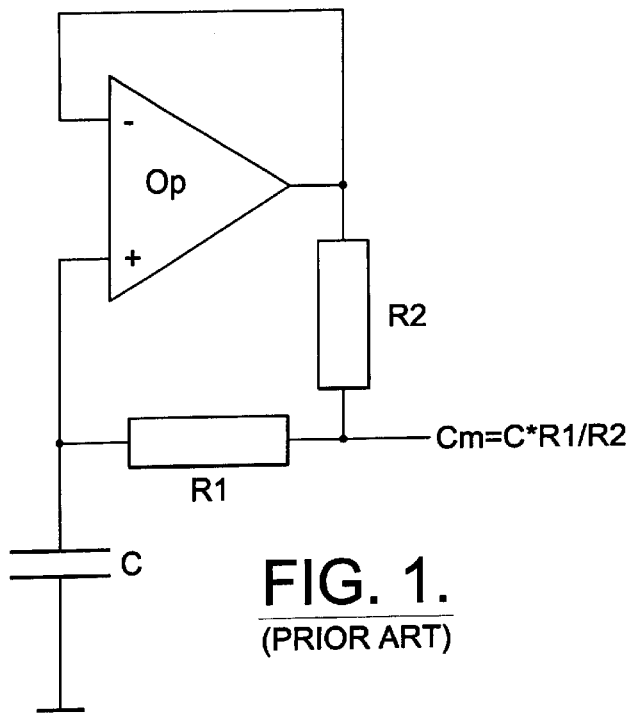
FIG. 1 is a functional diagram of a capacitance multiplier circuit in accordance with the prior art, as described above.

The operation of the multiplier circuit is similar to that of the known circuit in FIG. 1 and the connection node Cm between the two field effect transistors M2 and M1 constitutes the terminal for a virtual capacitance. This capacitance is given by: Cm=RM1/RM2 C, wherein RM1 is the actual channel resistance of transistor M1 and RM2 is the actual channel resistance of the M2 transistor, at their respective biasing conditions. Under these biasing conditions both transistors should be operated in the ohmic region.

A biasing circuit produces (on two output nodes BIAS1 and BIAS 2) biasing voltages for the transistors M1 and M2. The value of the voltages produced by the biasing circuit can be constant, or the voltage of one or of the other may be made dependent on temperature in accordance with a certain law of dependency. The biasing voltages: BIAS1 and BIAS2, are fed to the gate terminal of the field effect transistors M1 and M2, respectively. As stated above, this permits a certain dependence of the channel resistances of the two transistors as a function of the temperature variation. When implementing an integrated RC filter circuit, such a possibility of variation of the resistive ratio of the transistors M1 and M2 may be exploited for compensating a corresponding variation of the value of an integrated resistance (R) of the RC circuit with a temperature variation. In other words, the capacitance multiplier circuit according to this preferred embodiment may be exploited for implementing temperature compensated integrated RC circuits.

Figure 3:
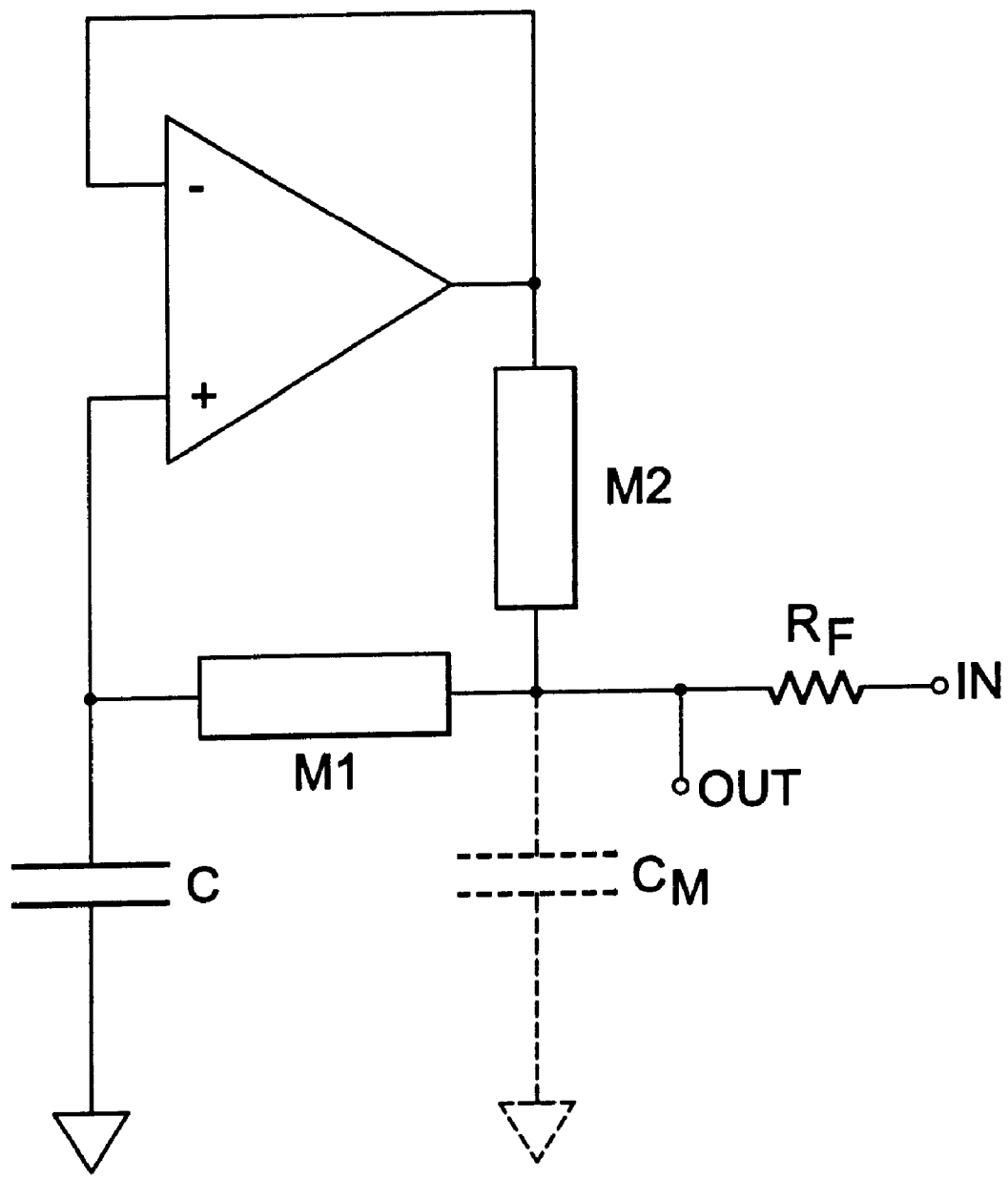
FIG. 3 is a temperature compensation circuit according to the prior art.

FIG. 3 shows a simple RC circuit, using the capacitance-multiplier circuit of FIG. 2 to provide a multiplied (virtual) capacitance $C_M$, indicated in dotted lines. This capacitance, in combination with the series resistor RF, which may be a polysilicon resistor provides a simple RC filter stage with a time constant of $\tau = R_F C_M$.

However, integrated circuit resistors typically have significant temperature dependence in their resistance values. (The value of an integrated resistor can easily vary by 70% over the 100° C. of operating temperature range of many integrated circuit specifications.) Thus, the time constant of a simple RC filter stage will have a correspondingly large variation, which is unacceptable in many applications.

This circuit provides improved temperature compensation according to the present inventions. The capacitance is dynamically adjusted to compensate for the temperature dependency of the resistor, and thereby greatly reduce the temperature dependency of the RC time constant.

Figure 4:
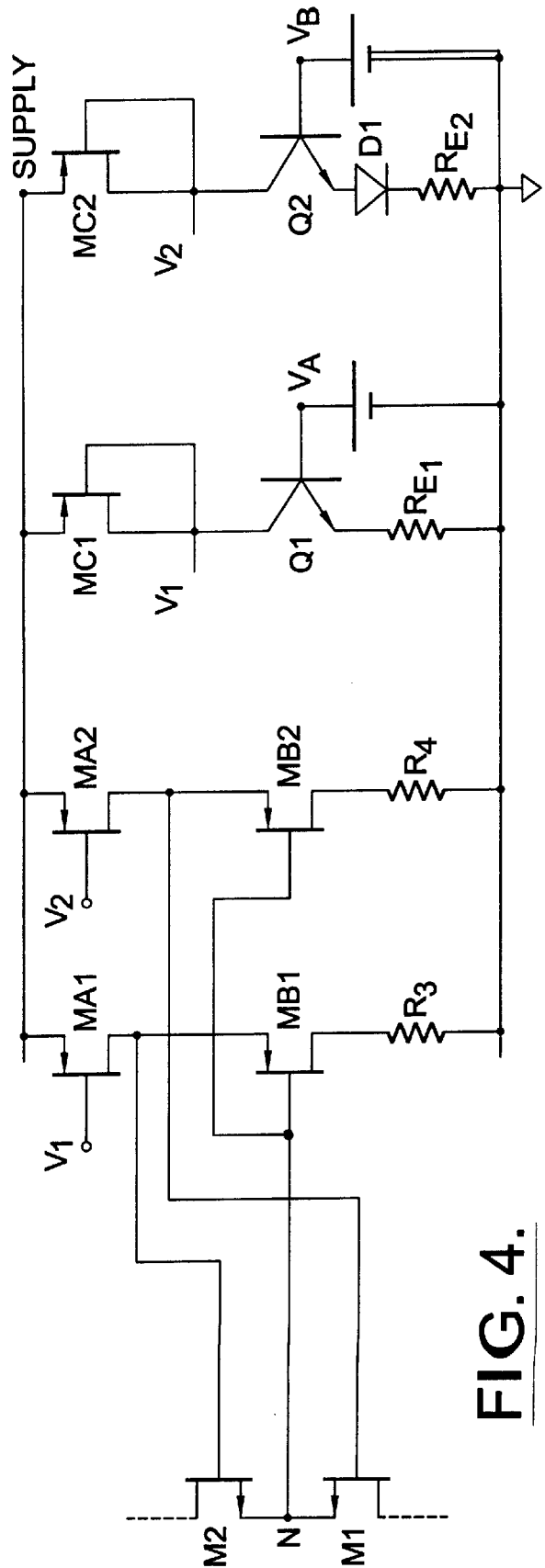
FIG. 4 is an embodiment of the biasing circuit according to the invention.

FIG. 4 shows a biasing circuit in which $V_A$ and $V_B$ are stable with respect to temperature. The respective emitter currents of bipolar transistors Q1 and Q2 will have different temperature dependencies, because of the different behavior of resistors and diodes (compare Q1's emitter load RE1 with Q2's emitter load D1+RE2) and this difference will be mirrored through transistors MC1/2 onto PMOS transistors MA1/2, to produce a temperature-dependent difference in the gate voltages of M1 and M2.

As will be evident to those skilled in the art, the two field effect transistors M1 and M2 of the circuit of the invention may also be p-channel transistors. In this case, the two transistors will have their source connected in common to the node Cm and also would have their respective drains connected to a terminal of a physical capacitor C and to the output node of the buffer Op. Of course, in this case the biasing voltages for the two transistors (BIAS1 and BIAS2), may be negative as referred to the ground potential.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Of course, the uses of the disclosed capacitance-multiplier circuit are not by any means limited to the example shown in FIG. 3. The disclosed innovative ideas can be adapted to other filter configurations, to timing or analog integration functions, or to other functions in which a large effective capacitance value is desired.

The disclosed circuit is particularly advantageous for integrated circuit filters which have cutoff frequencies in the audio band or below. For example, for an analog filter for rejecting power-line hum, a time constant of the order of 100 milliseconds might be desired. This can be done, for example, with a capacitance value of 100 pF, a ratio of 1000:1 between the transistor W/L values, and a physical resistor of 1MΩ.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated capacitance multiplier circuit, comprising:

an integrated circuit capacitor;

first and second field-effect transistors, integrated on a common substrate with said capacitor; said first transistor having a width-to-length ratio which is more than ten times the width-to-length ratio of said second transistor;

a biasing circuit connected to bias said first and second transistors, into an ohmic regime of operation, with first and second respective gate voltages which have different temperature dependences;

an operational amplifier configured and operatively connected to follow the potential of a first terminal of said capacitor, and to drive a first source/drain terminal of said second transistor with a corresponding voltage;

said second transistor having a second source/drain terminal which is connected to a capacitance node;

said first transistor being connected in series between said capacitance node and said first terminal of said capacitor;

whereby said capacitance node sees an effective capacitance which is much greater than the capacitance of said capacitor.

2. The integrated circuit of claim 1, wherein said capacitor is an MOS capacitor.

3. The integrated circuit of claim 1, wherein said biasing circuit comprises first and second load elements with unequal temperature dependences, and translation elements configured to translate the unequal temperature dependencies of said load elements to provide said gate voltages.

4. The integrated circuit of claim 1, further comprising a polysilicon resistor connected to said capacitance node, whereby signals applied across said resistor see a very large time constant.

5. An integrated capacitance multiplier circuit comprising:

a capacitor having a first terminal connected to a lower common voltage, and also having a second terminal;

an operational amplifier having an output connected to an inverting input thereof, and having a non-inverting input connected to said second terminal of said capacitor;

a biasing circuit with at least two separate bias voltage outputs;

first and second field effect transistors having respective source regions thereof electrically connected together, and having respective gates connected to said bias voltage outputs of said biasing circuit;

said first transistor having a drain region connected to said second terminal of said capacitor, and said second transistor having a drain region connected to said output of said operational amplifier; and a multiplied-capacitance connection at said sources of said transistors;

whereby said multiplied-capacitance connection provides an effective capacitance to said common voltage which is a multiple of the physical capacitance of said capacitor, multiplied in an amount which depends on the ratio of the conductances of said transistors.

6. The integrated circuit of claim 5, wherein said capacitor is an MOS capacitor.

7. The integrated circuit of claim 5, wherein said biasing circuit comprises first and second load elements with unequal temperature dependences, and translation elements configured to translate the unequal temperature dependencies of said load elements to provide said bias voltage outputs.

8. The integrated circuit of claim 5, further comprising a polysilicon resistor connected to said capacitance node, whereby signals applied across said resistor see a very large time constant.

9. A capacitance multiplier circuit comprising a non-inverting operational amplifier configured as a voltage follower, a physically integrated capacitor of a certain capacitance having a terminal connected to a non-inverting input of the amplifier, a network comprising two resistances having a certain resistance ratio between each other, functionally connected in series between an output node of said amplifier and said non-inverting input, a connection node between said series connected resistances constituting a terminal of a virtual capacitance equal to the product of the capacitance of said physical capacitor by said ratio, two field effect transistors, each having a control gate, a source region and a drain region separated by a channel region of dimensions suitable to provide said resistances, with said certain ratio, as the respective channel resistances of said two transistors under conducting conditions, said transistors being functionally connected in opposition to each other between said output node and said non-inverting input of the operational amplifier and biased in a state of conduction.

10. A capacitance multiplier circuit as defined in claim 9, further comprising a biasing circuit having at least two output nodes on which a biasing voltage is produced by the circuit and which are connected to the control gate of said two transistors, respectively; the circuit being capable of generating on at least one of said output nodes a biasing voltage that is a function of temperature for varying the ratio between the channel resistances of said two transistors in function of temperature.

11. A capacitance multiplier circuit as defined in claim 10, characterized by being an integrated circuit.

12. A temperature compensated integrated RC circuit comprising a capacitance multiplier circuit as defined in claim 11, and wherein a variation with temperature of the resistance value of the RC circuit is compensated by a variation of the value of the virtual capacitance of the RC circuit as produced by said capacitance multiplier circuit.

13. A method for providing a large time constant on an integrated circuit, comprising the steps of:

(A.) providing a substrate which includes at least one substantially monolithic body of semiconductor material, with active devices therein including at least:
an integrated circuit capacitor;
first and second field-effect transistors, said first transistor having a width-to-length ratio which is more than ten times the width-to-length ratio of said second transistor;
an operational amplifier configured and operatively connected to follow the potential of a first terminal of said capacitor, and to drive a first source/drain terminal of said second transistor with a corresponding voltage; and
a resistor having a first terminal connected to a capacitance node;
said second transistor having a second source/drain terminal which is connected to said capacitance node; and
said first transistor being connected in series between said capacitance node and said first terminal of said capacitor; and (B.) biasing said first and second transistors, into an ohmic regime of operation, with first and second respective gate voltages which have different temperature dependences;

(C.) whereby signals applied across said resistor see an effective RC time constant which is much greater than the product of the value of said resistor times the value of said capacitor, and which also has less temperature dependence than does the value of said resistor.

14. The method of claim 13, wherein said capacitor is an MOS capacitor.

15. The method of claim 13, wherein said biasing step uses first and second load elements with unequal temperature dependences, and translation elements configured to translate the unequal temperature dependencies of said load elements to provide gate voltages to said first and second transistors.

16. The method of claim 13, wherein said resistor is a polysilicon resistor.

17. A method for temperature compensating an integrated RC circuit which comprises an integrated resistor, an integrated capacitor and an integrated capacitance multiplier circuit capable of virtually multiplying the capacitance of said integrated capacitor by a term given by the ratio between two resistances to give a virtual capacitance value, comprising:

a) utilizing as said two resistances the ON resistances of two field effect transistors of different size;

b) biasing at least one of said transistors with a temperature dependent voltage for modifying the relative ON-resistance of the transistor and said ratio between ON resistances in function of temperature, thus varying said virtual capacitance value of the RC circuit in function of temperature to compensate a variation of the value of the integrated resistor of the RC circuit.

18. The method of claim 17, wherein said capacitor is an MOS capacitor.

19. The method of claim 17, wherein said biasing step uses first and second load elements with unequal temperature dependences, and translation elements configured to translate the unequal temperature dependencies of said load elements to provide gate voltages to said first and second transistors.

20. The method of claim 17, wherein said resistor is a polysilicon resistor.

21. The integrated circuit of claim 1, wherein said biasing circuit is connected to bias said first and said second transistors as a function of temperature for varying the ratio between the channel resistances of said transistors in function of temperature.

22. The integrated circuit of claim 5, wherein said biasing circuit is connected to bias said first and said second transistors as a function of temperature for varying the ratio between the channel resistances of said transistors in function of temperature.

* * * * *